United States Patent
Grimbergen (10) Patent No.: US 8,808,559 B2
(45) Date of Patent: Aug. 19, 2014

(54) ETCH RATE DETECTION FOR REFLECTIVE MULTI-MATERIAL LAYERS ETCHING

(75) Inventor: Michael Grimbergen, Redwood City, CA (US)

(73) Assignee: Applied Materials, Inc., Santa Clara, CA (US)

(*) Notice: Subject to any disclaimer, the term of this patent is extended or adjusted under 35 U.S.C. 154(b) by 123 days.

(21) Appl. No.: 13/543,845

(22) Filed: Jul. 8, 2012

(65) Prior Publication Data

US 2013/0130409 A1    May 23, 2013

Related U.S. Application Data

(60) Provisional application No. 61/562,719, filed on Nov. 22, 2011.

(51) Int. Cl.
| | |
|---|---|
| *G01L 21/30* | (2006.01) |
| *H01L 21/66* | (2006.01) |
| *H01J 37/32* | (2006.01) |
| *G03F 1/80* | (2012.01) |

(52) U.S. Cl.
CPC ............. *G03F 1/80* (2013.01); *H01J 37/32963* (2013.01); *H01J 37/32972* (2013.01)
USPC ........................ 216/60; 216/59; 438/8; 430/5

(58) Field of Classification Search
CPC .. G03F 1/80; H01J 37/32963; H01J 37/32972
USPC .................................. 216/59, 60; 430/5; 438/8
See application file for complete search history.

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,834,831 A | 5/1989 | Nishizawa et al. |
| 4,993,357 A | 2/1991 | Scholz |
| 5,225,366 A | 7/1993 | Yoder |
| 5,281,274 A | 1/1994 | Yoder |

(Continued)

FOREIGN PATENT DOCUMENTS

| | | |
|---|---|---|
| JP | 11-176815 | 7/1999 |
| KR | 10-2008-0099913 | 11/2008 |

OTHER PUBLICATIONS

PCT international search report and written opinion of PCT/US2012/063277 dated Mar. 18, 2013.

*Primary Examiner* — Shamim Ahmed
(74) *Attorney, Agent, or Firm* — Patterson & Sheridan, LLP (57) ABSTRACT

A method and apparatus for etching a photomask substrate with enhanced process monitoring, for example, by providing for optical monitoring at different regions of the photomask to obtain desired etch rate or thickness loss is provided. In one embodiment, the method includes performing an etching process on a reflective multi-material layer that includes at least one molybdenum layer and one silicon layer through a patterned mask, directing radiation having a wavelength from about 170 nm and about 800 nm to an area of the multi-material layer uncovered by the patterned mask, collecting an optical signal reflected from the area uncovered by the patterned mask, analyzing a waveform obtained from the reflected optical signal, and determining a first endpoint of the etching process when an intensity of the reflected optical signal is between about 60 percent and about 90 percent less than an initial reflected optical signal.

7 Claims, 5 Drawing Sheets

(56) References Cited

U.S. PATENT DOCUMENTS

| | | |
|---|---|---|
| 5,294,286 A | 3/1994 | Nishizawa et al. |
| 5,360,738 A | 11/1994 | Jones et al. |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,674,786 A | 10/1997 | Turner et al. |
| 5,711,811 A | 1/1998 | Suntola et al. |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,866,795 A | 2/1999 | Wang et al. |
| 5,879,459 A | 3/1999 | Gadgil et al. |
| 5,916,365 A | 6/1999 | Sherman |
| 5,923,056 A | 7/1999 | Lee et al. |
| 6,015,590 A | 1/2000 | Suntola et al. |
| 6,015,917 A | 1/2000 | Bhandari et al. |
| 6,028,669 A * | 2/2000 | Tzeng .................... 356/504 |
| 6,042,652 A | 3/2000 | Hyun et al. |
| 6,084,302 A | 7/2000 | Sandhu |
| 6,124,158 A | 9/2000 | Dautartas et al. |
| 6,139,700 A | 10/2000 | Kang et al. |
| 6,144,060 A | 11/2000 | Park et al. |
| 6,159,297 A | 12/2000 | Herchen et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,487 B1 | 3/2001 | Kim et al. |
| 6,231,672 B1 | 5/2001 | Choi et al. |
| 6,270,572 B1 | 8/2001 | Kim et al. |
| 6,284,646 B1 | 9/2001 | Leem |
| 6,287,965 B1 | 9/2001 | Kang et al. |
| 6,305,314 B1 | 10/2001 | Sneh et al. |
| 6,306,216 B1 | 10/2001 | Kim et al. |
| 6,342,277 B1 | 1/2002 | Sherman |
| 6,348,376 B2 | 2/2002 | Lim et al. |
| 6,358,629 B1 | 3/2002 | Aga |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,447,607 B2 | 9/2002 | Soininen et al. |
| 6,449,038 B1 | 9/2002 | Stolze |
| 6,451,119 B2 | 9/2002 | Sneh et al. |
| 6,451,695 B2 | 9/2002 | Sneh |
| 6,475,910 B1 | 11/2002 | Sneh |
| 6,476,276 B2 | 11/2002 | Matsui et al. |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,488,924 B1 | 12/2002 | Monteleone et al. |
| 6,511,539 B1 | 1/2003 | Raaijmakers |
| 6,551,406 B2 | 4/2003 | Kilpi |
| 6,749,974 B2 | 6/2004 | Chan |
| 7,771,895 B2 | 8/2010 | Wu et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0007790 A1 | 1/2002 | Park |
| 2002/0009544 A1 | 1/2002 | McFeely et al. |
| 2002/0020869 A1 | 2/2002 | Park et al. |
| 2002/0021544 A1 | 2/2002 | Cho et al. |
| 2002/0031618 A1 | 3/2002 | Sherman |
| 2002/0041931 A1 | 4/2002 | Suntola et al. |
| 2002/0048635 A1 | 4/2002 | Kim et al. |
| 2002/0052097 A1 | 5/2002 | Park |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076837 A1 | 6/2002 | Hujanen et al. |
| 2002/0078508 A1 | 6/2002 | George |
| 2002/0082296 A1 | 6/2002 | Verschoor et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0134307 A1 | 9/2002 | Choi |
| 2002/0144655 A1 | 10/2002 | Chiang et al. |
| 2002/0144857 A1 | 10/2002 | Toyoda |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0197402 A1 | 12/2002 | Chiang et al. |
| 2003/0004723 A1 | 1/2003 | Chihara |
| 2003/0013320 A1 | 1/2003 | Kim et al. |
| 2003/0031807 A1 | 2/2003 | Elers et al. |
| 2003/0042630 A1 | 3/2003 | Babcoke et al. |
| 2003/0049942 A1 | 3/2003 | Haukka et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2006/0040415 A1 | 2/2006 | Chou et al. |
| 2006/0151430 A1* | 7/2006 | Yang et al. .................. 216/59 |
| 2006/0292459 A1 | 12/2006 | Kamm et al. |
| 2007/0259457 A1* | 11/2007 | DiCarlo .................... 438/16 |
| 2011/0253671 A1 | 10/2011 | Lian et al. |

\* cited by examiner

ETCH RATE DETECTION FOR REFLECTIVE MULTI-MATERIAL LAYERS ETCHING

CROSS-REFERENCE TO RELATED APPLICATIONS

This application claims benefit of U.S. Provisional Application Ser. No. 61/562,719 filed Nov. 22, 2011, which is incorporated by reference in its entirety.

BACKGROUND OF THE INVENTION

1. Field of the Invention

Embodiments of the present invention generally relate to the fabrication of integrated circuits and to the fabrication of photomasks useful in the manufacture of integrated circuits.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

The next generation photomask as further discussed below is formed a glass or a quartz substrate having a multilayer film stack disposed thereon. The multilayer film stack may include an anti-reflective coating layer, an absorber layer, a capping layer, and a reflective multi-material layer. When manufacturing the photomask, a photoresist layer is disposed on the film stack to facilitate transferring features into the film stack during the subsequent patterning processes. During the patterning process, the circuit design is written onto the photomask by exposing portions of the photoresist to extreme ultraviolet light or ultraviolet light, making the exposed portions soluble in a developing solution. The soluble portion of the resist is then removed, allowing the underlying film stack exposed through the remaining photoresist to be etched. The etch process removes the film stack from the photomask at locations where the resist was removed, i.e., the exposed film stack is removed.

With the shrink of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. There are several NGL candidates, such as extreme ultraviolet (EUV) lithography (EUVL), electron projection lithography (EPL), ion projection lithography (IPL), nano-imprint, and X-ray lithography. Among these, EUVL is the most likely successor due to the fact that EUVL has most of the properties of optical lithography, which is a more mature technology as compared with other NGL methods.

Accordingly, the film stack is being developed to have a new film scheme so as to work with the EUV technology to facilitate forming the photomask with desired features disposed thereon. The film stack may include multiple layers with different new materials to be etched to form the desired features. Imprecise etch process and etch endpoint control may result in critical dimension (CD) bias, poor critical dimension (CD) uniformity, undesired cross sectional profile and etch critical dimension (CD) linearity and unwanted defects. It is believed that EUV technology may provide good CD uniformity, less etching bias, desired linearity, less line edge roughness, and high thickness uniformity and less defectivity.

As the new developed film stack described above includes an anti-reflective coating layer, an absorber layer, a capping and a reflective multi-material layer, obtaining precise etching endpoint for each of the layers being etched is becoming more and more difficult. Inaccurate etch endpoint control will often result in etch bias which may result in accurate transfer of the patterns to the film stack with desired critical dimension less than about 5 µm. This results in non-uniformity of the etched features of the photomask and correspondingly diminishes the ability to produce features for devices having small critical dimensions using the photomask. As the critical dimensions of photomask continue to shrink, the importance of accurate etching endpoint control increases. Thus, an accurate etching process endpoint control to the film stack disposed on the photomask for EUV technology is highly desirable.

Therefore, there is an ongoing need for improved etching endpoint process control in photomask fabrication, including improved apparatus and methods for collecting etch rate data and determining process endpoint.

SUMMARY OF THE INVENTION

The present invention provides a method and apparatus for etching a photomask substrate with enhanced process monitoring, for example, by providing for optical monitoring at certain regions of the photomask to obtain desired etch rate or thickness loss. In one embodiment, a method of determining an etching endpoint of a reflective multi-material layer disposed on a substrate during an etching process includes performing an etching process on a reflective multi-material layer, wherein the reflective multi-material layer includes at least one molybdenum layer and one silicon layer disposed on a first surface of a substrate through a patterned mask layer in a plasma etch chamber, directing radiation having a wavelength from about 170 nm and about 800 nm to an area of the multi-material layer uncovered by the patterned mask layer during the etching process, collecting an optical signal reflected from the area uncovered by the patterned mask layer, analyzing a waveform obtained from the reflected optical signal, and determining a first endpoint of the etching process when an intensity of the reflected optical signal is between about 60 percent and about 90 percent less than an initial reflected optical signal.

In another embodiment, a method of determining an etching endpoint of a reflective multi-material layer disposed on a substrate during an etching process includes performing an etching process on a reflective multi-material layer, wherein the reflective multi-material layer includes at least one molybdenum layer and one silicon layer disposed on a first surface of a substrate through a patterned mask layer in a plasma etch chamber, directing radiation having a wavelength from about 170 nm and about 500 nm to an area of the multi-material layer uncovered by the patterned mask layer during the etching process, collecting an optical signal reflected from the area uncovered by the patterned mask layer, analyzing an interference waveform obtained from the reflected optical signal, and calculating numbers of the fringes appeared in the interference waveform to determine an process endpoint for the etching process.

In yet another embodiment, a method of determining an etching endpoint of a reflective multi-material layer disposed on a substrate during an etching process includes performing an etching process on a reflective multi-material layer, wherein the reflective multi-material layers includes at least one molybdenum layer and one silicon layer disposed on a first surface of a substrate through a patterned mask layer in a plasma etch chamber, directing radiation having a wavelength from about 170 nm and about 500 nm to an area of the multi-material layer uncovered by the patterned mask layer during the etching process, collecting an optical signal reflected from the area uncovered by the patterned mask layer, analyzing a reflective waveform obtained from the reflected optical signal, and determining a process endpoint of the etching process when an intensity of the reflected optical signal obtained from the reflective waveform becomes constant.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching a photomask substrate with enhanced process monitoring, for example, by providing for optical monitoring at certain regions of the photomask to obtain desired etch rate or endpoint determination. Although the discussions and illustrative examples focus on the etching rate detection and process endpoint determination during an etching process for etching reflective multi-material layers disposed on a photomask substrate, various embodiments of the invention can also be adapted for process monitoring of other suitable substrates, including transparent or dielectric substrates, or optical disks.

Figure 1:
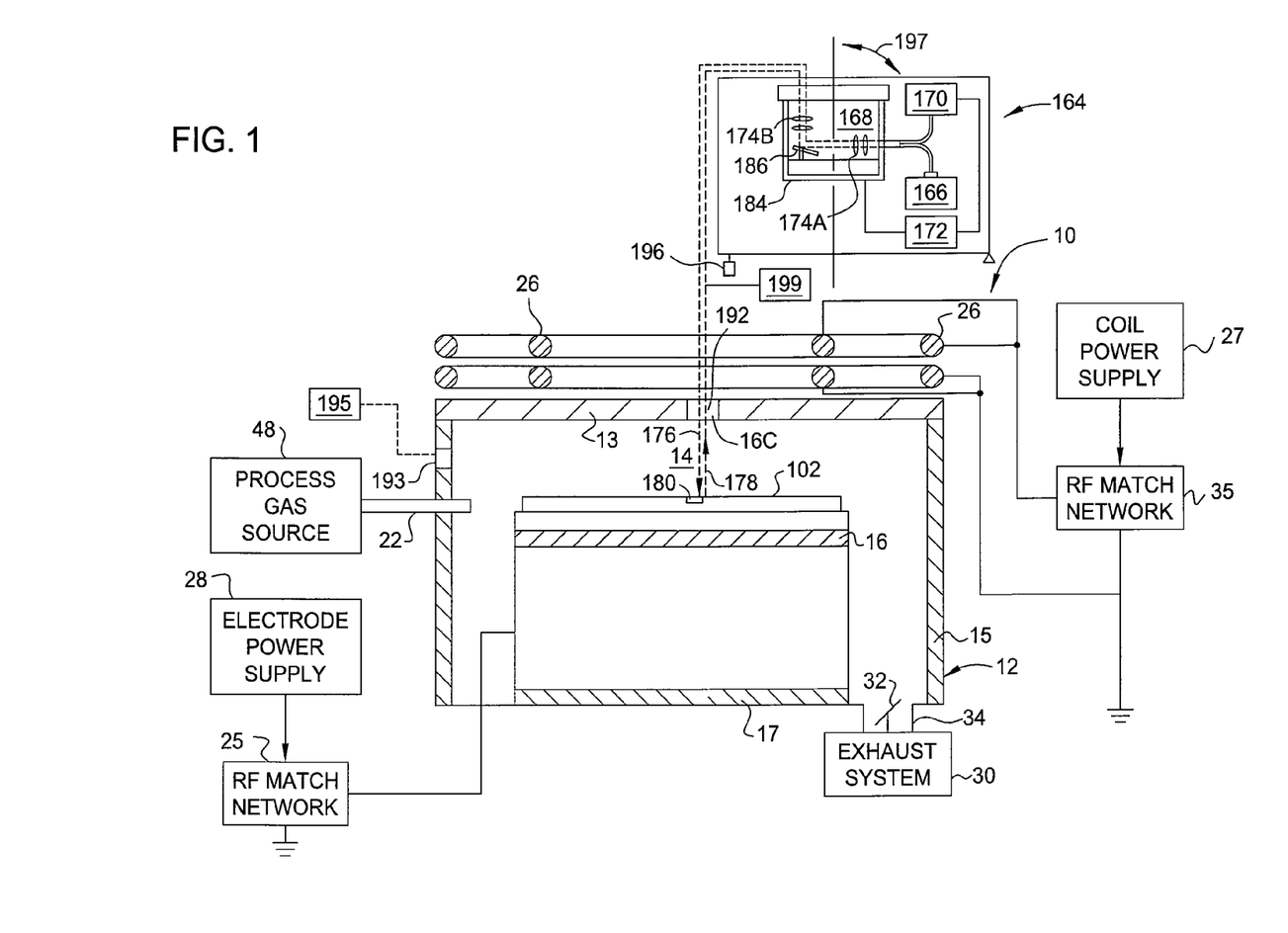
FIG. 1 illustrates a etch chamber incorporating one embodiment of the present invention.

FIG. 1 is a schematic cross sectional view of a plasma etch chamber 10 in accordance with one embodiment of the invention. Suitable plasma etch chambers that may be adapted to practice the invention include the Tetra™ II photomask etch chamber or the Decoupled Plasma Source (DPS™) chamber available from Applied Materials, Inc., of Santa Clara, Calif. Other suitably adapted process chambers may also be used in connection with embodiments of the invention, including, for example, capacitive coupled parallel plate chambers and magnetically enhanced ion etch chambers, as well as inductively coupled plasma etch chambers of different designs. The particular embodiment of the etch chamber 10 shown herein is provided for illustrative purposes and should not be used to limit the scope of the invention. It is contemplated that the invention may be utilized in other processing systems, including those from other manufacturers.

The etch chamber 10 generally includes a cylindrical sidewall or chamber body 12, an energy transparent chamber lid 13 mounted on the body 12, and a chamber bottom 17. The chamber lid 13 may be flat, rectangular, actuate, conical, dome or multi-radius shaped. At least one inductive coil 26 is disposed above at least a portion of the chamber lid 13. In the embodiment depicted in FIG. 1, two concentric coils 26 are shown. The chamber body 12 and the chamber bottom 17 of the etch chamber 10 can be made of a metal, such as anodized aluminum, and the chamber lid 13 can be made of an energy transparent material such as a ceramic or other dielectric material.

A substrate support member 16 is disposed in the etch chamber 10 to support a substrate 102 during processing. The support member 16 may be a conventional mechanical or electrostatic chuck with at least a portion of the support member 16 being electrically conductive and capable of serving as a process bias cathode. While not shown, a photomask adapter may be used to secure the photomask on the support member 16. The photomask adapter generally includes a lower portion configured to cover an upper portion of the support member and a top portion having an opening that is sized and shaped to hold a photomask. In one embodiment, the top portion of the photomask adapter has a square opening. A suitable photomask adapter is disclosed in U.S. Pat. No. 6,251,217, issued on Jun. 26, 2001, which is incorporated herein by reference.

Process gases are introduced into the etch chamber 10 from a process gas source 48 through a gas distributor 22 peripherally disposed about the support member 16 and/or disposed in the chamber lid 13. Mass flow controllers (not shown) for each process gas, or alternatively, for mixtures of the process gas, are disposed between the etch chamber 10 and the process gas source 48 to regulate the respective flow rates of the process gases.

A plasma zone 14 is defined in the etch chamber 10 between the substrate support member 16 and the chamber lid 13. A plasma is generated in the plasma zone 14 from the process gases by supplying power from a power supply 27 to the inductive coils 26 through an RF match network 35. The support member 16 may include an electrode disposed therein, which is powered by an electrode power supply 28 and generates a capacitive electric field in the etch chamber 10 through an RF match network 25. Typically, RF power is applied to the electrode in the support member 16 while the body 12 is electrically grounded. The capacitive electric field, which is transverse to the plane of the support member 16, influences the directionality of charged species to provide more anisotropic etching of the substrate 102.

Process gases and etchant byproducts are exhausted from the etch chamber 10 through an exhaust port 34 to an exhaust system 30. The exhaust port 34 may be disposed in the bottom 17 of the etch chamber 10 or may be disposed in the body 12 of the etch chamber 10 for removal of process gases. A throttle valve 32 is provided in the exhaust port 34 for controlling the pressure in the etch chamber 10.

In one embodiment, an etch rate (or endpoint) detection system 164 operatively coupled to the etch chamber 10. At least one optical access ports or viewports are provided in different regions of the substrate support member 16, lid 13 and/or chamber body 12. In the example shown in FIG. 1, the optical access port comprises respectively a window 192 at a central region 16C of the chamber lid 13. The endpoint detection system 164 is configured to detect optical signals through the window 192. It is noted that more than one window may be formed in the chamber lid 13 or other locations of the etch chamber 10 which allows optical monitoring of various locations on a photomask substrate 102 from its surface during etching. Alternatively, different numbers of windows may be provided at other locations of the lid 13, chamber body 12 and/or substrate support member 16 as needed. For example, a side window 193 may be formed on the chamber wall 15 having a second etch rate detection system 195 coupled thereto to facilitate etch rate determination process. A camera 199 may be disposed adjacent to the etch rate detection system 164 to assist in confirming that the radiation from the etch rate detection system 164 is interfacing with a correct location on the substrate surface for detection.

In general, a larger window facilitates the installation of optical components. However, the size of the window, especially in the central region 16C of the chamber lid 13, is selected to be sufficiently large for optical monitoring, yet small enough to avoid potential adverse impact for the RF interference. Selecting a small window also improves the lateral temperature uniformity of the chamber lid 13. The optical access port may generally comprise a flat window made of quartz or other materials that transmit light over a broad wavelength spectrum, including deep ultraviolet and are resistant to plasma attack. A more detailed discussion of different optical configurations will be provided further below.

The endpoint detection system 164 comprises optical setup for operating in at least one of reflection, interferometry or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof. In one particular embodiment depicted therein, the endpoint detection system 164 is configured to detect a process endpoint based on a change in the reflectance reflected from an etched substrate surface.

The reflection mode of operation allows reflectance (or reflectometry) and interferometric measurement to be performed. The endpoint detection system 164 generally comprises an optical light source 166, a focusing assembly 168 for focusing an incident optical beam 176 from the optical light source 166 onto a discreet area (spot) 180 on the surface of substrate 102, and a photodetector 170 for measuring the intensity of a reflected optical beam 178 reflected off the spot 180 of the substrate 102. Any adjustment mechanism 196 may be provided to set an incidence angle 197 of the beam 176 so that the spot 180 may be selectively located on a desired location on the substrate 102. The adjustment mechanism 196 may be an actuator, set screw or other device suitable for setting the incidence angle 197 by moving (tilting) the endpoint detection system 164 itself or a component therein, such as with an optical beam positioned 184, further discussed below. The photodetector 170 may be a single wavelength or multi-wavelength detector, or a spectrometer. Based on the measured signal of the reflected optical beam 178, a computer system 172 calculates portions of the real-time waveform and compares it with a stored characteristic waveform pattern to extract information relating to the etch process. In one embodiment, the calculation may be based on slope changes or other characteristic changes in the detected signals, either in reflection or transmission mode, for example, when a film is etched to a target depth. Alternatively, the calculation may be based on interferometric signals as the depth of a trench or the thickness of a film changes during etching. In other embodiments, more detailed calculations may be performed based on interferometric signals obtained over a wide spectrum in order to determine the depth or thickness at any point in the etch process to determine etch rate of the object being etched.

The light source 166 may be monochromatic, polychromatic, white light, or other suitable light source. In general, the optical signal from the reflected optical beam 178 may be analyzed to extract information regarding the presence or absence of a layer (e.g., an anti-reflective coating layer or an absorber layer), or the thickness of certain material layers within the spot 180. The intensity of the incident optical beam 176 is selected to be sufficiently high to provide a reflected optical beam 178 with a measurable intensity. The lamp can also be switched on and off to subtract background light. In one embodiment, the light source 166 provides polychromatic light, e.g., from an Hg—Cd lamp, an arc lamp, or a light emitting diode (LED) or LED array, which generate light in wavelength ranges from about 170 nm to about 800 nm, or about 200 to 800 nm, for example about 250 nm to about 800 nm respectively. The polychromatic light source 166 can be filtered to provide an incident optical beam 176 having selected frequencies. Color filters can be placed in front of the photodetector 170 to filter out all wavelengths except for the desired wavelength of light, prior to measuring the intensity of the reflected optical beam 178 entering the photodetector 170. The light can be analyzed by a spectrometer (array detector with a wavelength-dispersive element) to provide data over a wide wavelength range, such as ultraviolet to visible, from about 200 nm to 800 nm. The light source 166 can also comprise a flash lamp, e.g., a Xe or other halogen lamp, or a monochromatic light source that provides optical emission at a selected wavelength, for example, a He—Ne or ND-YAG laser. The light source may be configured to operate in a continuous or pulsed mode. Alternatively, the wavelength range may be expanded into the deep UV as low as 170 nm or beyond using optical materials with stable deep UV transmission and purging air paths with inert gas or other suitable carrier gas, such as nitrogen gas.

One or more convex focusing lenses 174A, 1748 may be used to focus the incident optical beam 176 to the spot 180 on the substrate surface, and to focus the reflected optical beam 178 back on the active surface of photodetector 170. The spot 180 should be sufficiently large to compensate for variations in surface topography of the substrate 102 and device design features. This enables detection of etch endpoints for high aspect ratio features having small openings, such as vias or deep narrow trenches, which may be densely present or more isolated. The area of the returning reflected optical beam 178 should be sufficiently large to activate a large portion of the active light-detecting surface of the photodetector 170. The incident and reflected optical beams 176, 178 are directed through the transparent window 192 in the etch chamber 10 that allows the optical beams to pass in and out of the processing environment.

The diameter of the beam spot 180 is generally about 2 mm to about 10 mm. However, if the beam spot 180 encompasses large isolated areas of the substrate 102 containing only a small number of etched features, it may be necessary to use a larger beam spot in order to encompass a greater number of etched features. The size of the beam spot can therefore be optimized, depending on the design features for a particular device. If the signal is sufficient, a large beam spot or field of view will enable process control without precisely matching the position of the substrate support hole and the etched area of the substrate giving rise to the signal.

Optionally, the optical beam positioner 184 may be used to move the incident optical beam 176 across the substrate 102 to locate a suitable portion of the substrate surface on which to position the beam spot 180 to monitor an etching process. The optical beam positioner 184 may include one or more primary mirrors 186 that rotate at small angles to deflect the optical beam from the light source 166 onto different positions of the substrate surface. Additional secondary mirrors may be used (not shown) to direct the reflected optical beam 178 on the photodetector 170. The optical beam positioner 184 may also be used to scan the optical beam in a raster pattern across the surface of the substrate 102. In this embodiment, the optical beam positioner 184 comprises a scanning assembly consisting of a movable stage (not shown), upon which the light source 166, the focusing assembly 168 and the photodetector 170 are mounted. The movable stage can be moved through set intervals by a drive mechanism, such as a stepper motor or galvanometer, to scan the beam spot 180 across the substrate 102.

The photodetector 170 comprises a light-sensitive electronic component, such as a photovoltaic cell, photodiode, phototransistor, or photomultiplier, which provides a signal in response to a measured intensity of the reflected optical beam 178. The signal can be in the form of a change in the level of a current passing through an electrical component or a change in a voltage applied across an electrical component. The photodetector 170 can also comprise a spectrometer (array detector with a wavelength-dispersive element) to provide data over a wide wavelength range, such as ultraviolet to visible, from about 170 nm to 800 nm. The reflected optical beam 178 undergoes constructive and/or destructive interference which increases or decreases the intensity of the optical beam, and the photodetector 170 provides an electrical output signal in relation to the measured intensity of the reflected optical beam 178. The electrical output signal is plotted as a function of time to provide a spectrum having numerous waveform patterns corresponding to the varying intensity of the reflected optical beam 178.

In another embodiment, a plasma signal, e.g., plasma emission generated in the plasma zone, may also be utilized as the radiation source is place of external one, and be collected for detection as needed for different process requirements, such as endpoint control.

A computer program on a computer system 172 analyzes the shape of the measured waveform pattern of the reflected optical beam 178 to determine the endpoint of the etching process. The waveform generally has a sinusoidal-like oscillating shape, with the trough of each wavelength occurring when the depth of the etched feature causes the return signal to be 180 degrees out of phase with the return signal reflected by the overlaying layer. The endpoint may be determined by calculating the etch rate using the measured waveform, phase information of the measured waveform and/or comparison of the measured waveform to a reference waveform. As such, the period of the interference signal may be used to calculate the depth and etch rate. The program may also operate on the measured waveform to detect a characteristic waveform, such as, an inflection point indicative of a phase difference between light reflected from different layers. The operations can be simple mathematic operations, such as evaluating a moving derivative to detect an inflection point.

Figure 2A:
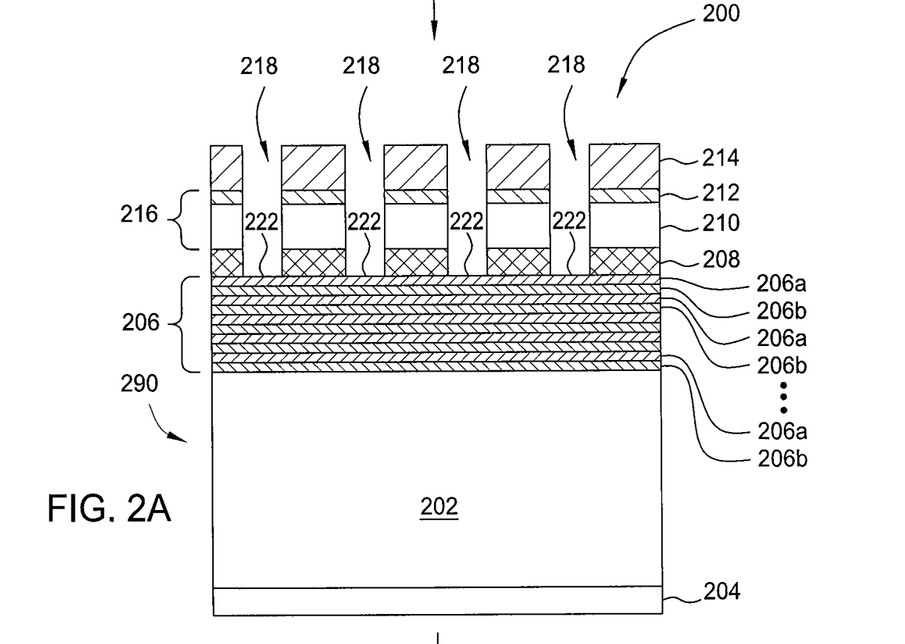
FIG. 2A-2B illustrate schematically structures of one embodiment of the photomasks prior to and after an reflective multi-material layer etching process.
Figure 2B:
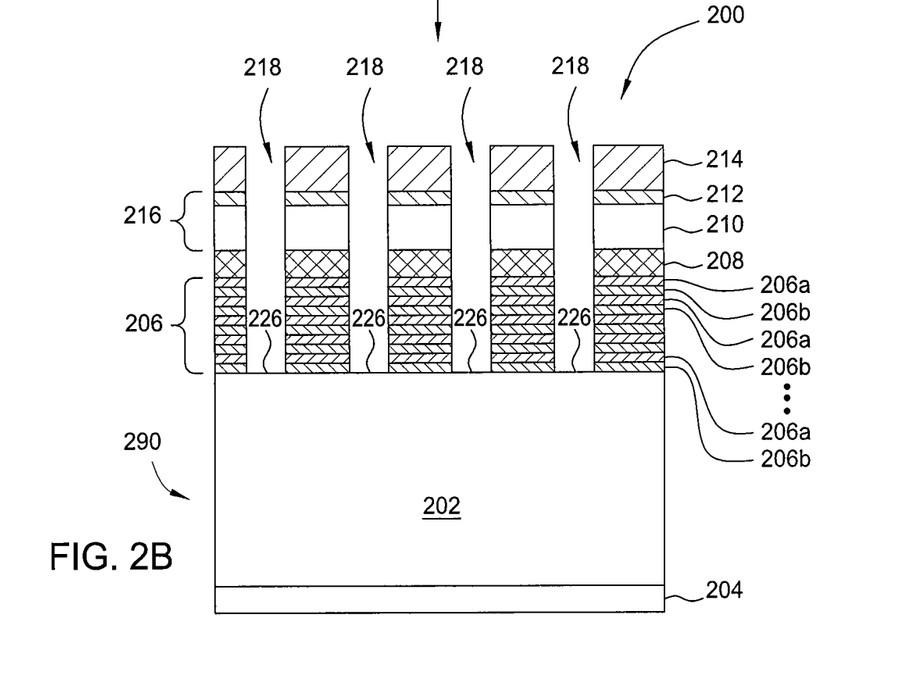

FIG. 2A-2B depict a photomask substrate 102 with a film stack 200 disposed thereon prior to and after a reflective multi-material layer etching process is performed to etch the reflective multi-material layer. The reflective multi-material layer etching process may be monitored by different etch rate detection and endpoint determination techniques according to one embodiment of the present invention. The film stack 200 disposed on the photomask substrate 102 that may be utilized to form desired features (such as openings) 218 in the film stack 200. As the exemplary embodiment depicted in FIG. 2A, the photomask substrate 102 may be a quartz substrate or a special low thermal expansion (LTE) glass with expansion less than that of quartz. The photomask substrate 102 has a rectangular shape having sides between about 5 inches to about 9 inches in length. The photomask substrate 102 may be between about 0.15 inches and about 0.25 inches thick. In one embodiment, the photomask substrate 102 is about 0.25 inches thick. An optional chromium containing layer 204, such as a chromium nitride (CrN) layer may be disposed to a backside of the photomask substrate 102 as needed.

An EUV reflective multi-material layer 206 is disposed on the photomask substrate 102. The reflective multi-material layer 206 include a plurality of layer pairs, each pair comprising one molybdenum layer 206a and one silicon layer 206b. Although the embodiment depicted in FIG. 2A and 2B shows five pairs of molybdenum layer 206a and silicon layer 206b (alternating molybdenum layers 206a and the silicon layers 206b repeatedly formed on the photomask substrate 102), it is noted that number of molybdenum layers 206a and the silicon layers 206b may be varied based on different process needs. In one particular embodiment, forty pairs of molybdenum layers 206a and the silicon layers 206b may be deposited to form the reflective multi-material layer 206. In one embodiment, the thickness of each single molybdenum layer 206a may be controlled at between about 10 Å and about 100 Å, such as about 30 Å, and the thickness of the each single silicon layer 106b may be controlled at between about 10 Å and about 100 Å, such as about 40 Å. The reflective multi-material layer 206 may have a total thickness between about 100 Å and about 5000 Å. The reflective multi-material layer 206 may have an EUV light reflectivity of up to 70% at 13.5 nm wavelength. For example, the reflective multi-material layer 206 may have a total thickness between about 250 nm and about 300 nm.

Subsequently, a capping layer 208 is disposed on the reflective multi-material layer 206. The capping layer 208 may be fabricated by a metallic material, such as ruthenium (Ru) material, zirconium (Zr) material, or any other suitable material. In the embodiment depicted in FIG. 2A, the capping layer 208 is a ruthenium (Ru) layer. The capping layer 208 has a thickness between about 1 nm and about 10 nm.

An absorber layer 216 may then be disposed on the capping layer 208. The absorber layer 216 is an opaque and light-shielding layer configured to absorb portion of the light generated during the lithography process. The low-reflection (LR) absorber layer 216 may be in form of a single layer or a multi-layer structure, such as including an antireflective coating layer 212 disposed on a bulk absorber layer 210, as the embodiments depicted in FIG. 2A. In one embodiment, the absorber layer 216 has a total film thickness between about 50 nm and about 200 nm. The total thickness of the absorber layer 216 advantageously facilitates meeting the strict overall etch profile tolerance for EUV masks in sub-45 nm technology node applications.

In one embodiment, the bulk absorber layer 210 may comprise tantalum-based materials with essentially no oxygen, for example tantalum silicide based materials, such as TaSi, nitrogenized tantalum boride-based materials, such as TaBN, and tantalum nitride-based materials, such as TaN. The antireflective coating layer 212 may be fabricated from a tantalum and oxygen-based materials. The composition of the antireflective coating layer 212 corresponds to the composition of the bulk absorber layer 210 and may comprise oxidized and nitrogenized tantalum and silicon based materials, such as TaSiON, when the bulk absorber layer 210 comprises TaSi or TaSiN; tantalum boron oxide based materials, such as TaBO, when the bulk absorber layer 210 comprises TaBN; and oxidized and nitrogenized tantalum-based materials, such as TaON, when the bulk absorber layer 210 comprises TaN.

A patterned photoresist layer 214 is then formed over the low reflection absorber layer 216 having openings 218 formed therein that expose portions 220 of the absorber layer 216 for etching. The photoresist layer 214 may comprise any suitable photosensitive resist materials, such as an e-beam resist (for example, a chemically amplified resist (CAR)), and deposited and patterned in any suitable manner. The photoresist layer may be deposited to a thickness between about 70 nm and about 500 nm.

The photomask substrate 102 is readily to be transferred to an etching processing chamber, such as the etch chamber 100 depicted with referenced to FIG. 1, to perform an etching process. The absorber layer 216 and the capping layer 208 may be etched sequentially using the patterned photoresist layer 214 as an etching mask layer until the underlying surface 222 of the reflective multi-material layer 206 is exposed, as shown in FIG. 2A. FIG. 2B depicts a portion of the reflective multi-material layer 206 is etched away using the patterned photoresist layer 214, the etched absorber layer 216 and the capping layer 208 as the etching mask layer to protect certain portion of the reflective multi-material layer 206 from being etched. During etching of the reflective multi-material layer 206, the endpoint detection system 164 is turned on during the etching process to monitor the etching progress to determine a proper etching process endpoint, which will be discussed in detail further below with referenced to FIGS. 3-4C. The etching process is performed to etch the reflective multi-material layer 206 exposed through the opening 218 defined by the photoresist layer 214 and the etched absorber layer 216 and the capping layer 208. The etching process is performed to etch the reflective multi-material layer 206 until the underlying surface of the substrate 102 is exposed. The patterns from the photoresist layer 214 are then transferred into the reflective multi-material layer 206 through the etching process. In another process, the multi-material layer is intentionally partially etched (for example only 15 pairs of 40 pairs removed) to provide a desired phase height difference between the remaining multilayer and the top of the low reflection absorber layer 216. In this embodiment, a transmission mode of light radiation may be utilized to direct a radiation from a bottom of the substrate. As part of the reflective multi-material layer 206 are etched away gradually, the whole reflective multi-material layer film stack may gradually become transmissive, thereby allowing light radiation to pass therethrough from the bottom of the substrate.

During etching of the reflective multi-material layer 206, as the reflective multi-material layer 206 may include more than one types of the materials, the etching gas mixture as selected is configured to have high etching capability to etch different materials as well as maintaining high selectivity to the upper capping layer 208 and the absorber layer 216 so as to maintain desired sidewall profiles to complete the photomask manufacture process.

Figure 3:
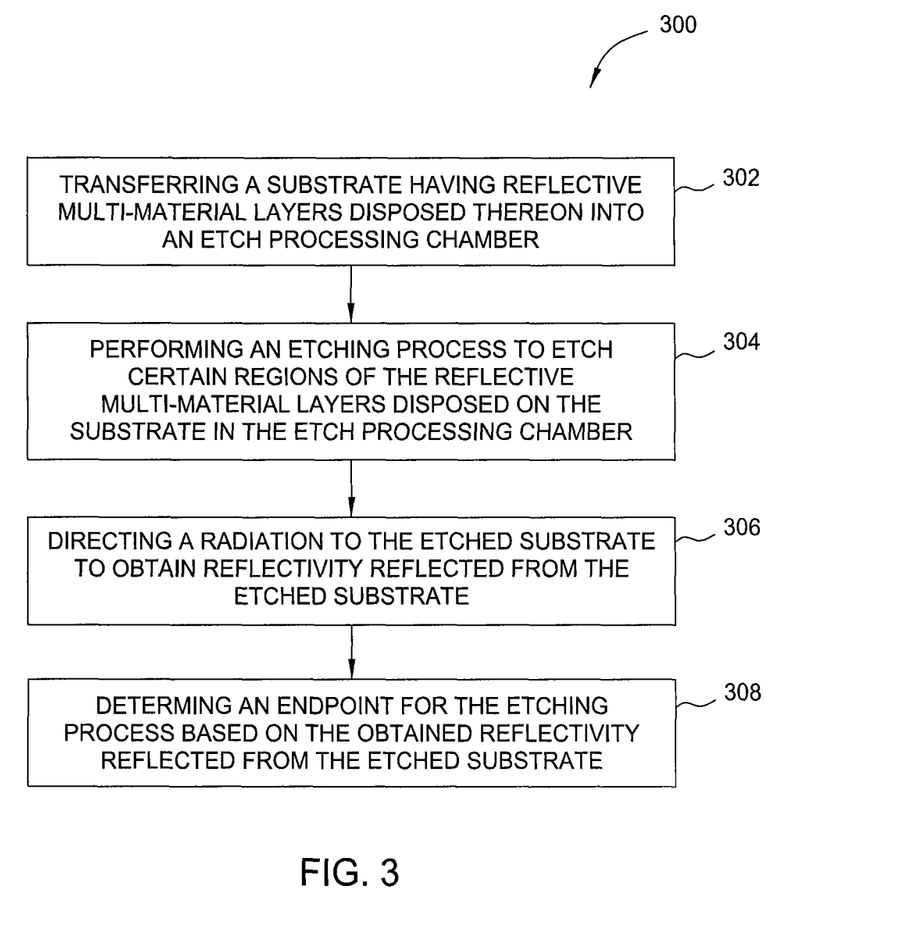
FIG. 3 illustrates a flow diagram regarding an endpoint determination process during fabrication process depicted in FIGS. 2A-2B.

FIG. 3 is a flow diagram of one embodiment of a method 300 for etching reflective multi-material layers formed in a film stack disposed on a photomask, such as the reflective multi-material layer 206 formed in the film stack 200 depicted in FIG. 2A, and determining an etching process endpoint for etching the reflective multi-material layers 206. Although the method 300 is described below with reference to a substrate utilized to fabricate a photomask, the method 300 may also be used to advantage in other photomask etching or any etching applications.

The method 300 begins at block 302 when the photomask substrate 102 is transferred to and placed on a substrate support member disposed in an etch reactor, such as the etch chamber depicted in FIG. 1. As described above, the photomask substrate 102 includes an optically transparent silicon based material, such as quartz (i.e., silicon dioxide ($SiO_2$)) layer having the reflective multi-material layer 206 disposed thereon having portions 220 of the reflective multi-material layer 206 exposed by the patterned photoresist layer 214 and the etched absorber layer 216 and capping layer 208 readily for etching, as depicted in FIG. 2A.

At block 304, an etching process is performed to etch the reflective multi-material layer 206 disposed on the substrate 102. The patterned photoresist layer 214 and the etched absorber layer 216 and the capping layer 208 may serve as a mask layer to protect some portion of the reflective multi-material layers 206 from being etched during the reflective multi-material layer etching process. The etching process endpoint detection for etching the reflective multi-material layer 206 can be monitored either in reflection or transmission mode, and reflectance, transmittance and/or interferometric signals can be performed. In one particular embodiment depicted therein, the process endpoint detection for etching the reflective multi-material layer 206 is monitored in reflection mode.

In one embodiment, the etching gas mixture includes at least a fluorine containing gas. Suitable examples of the fluorine containing gas includes $CF_4$, $CHF_3$, $CH_2F_2$, $C_2F_6$, $C_2F_8$, $SF_6$, $NF_3$ and the like. As the fluorine element is an aggressive etchant, the fluorine containing gas supplied in the etching gas mixture is utilized to etch away portions of the reflective multi-material layer 206, including both molybdenum layer 206a and silicon layer 206b, to form desired features into the reflective multi-material layers 206.

Furthermore, an oxygen containing gas may also be supplied in the etching gas mixture. As the aggressive fluorine etchant may also attack the exposed sidewalls of the upper capping layer 208 and the absorber layer 216, the oxygen containing gas as supplied in the etching gas mixture may assist forming and depositing polymers on the sidewalls of the etched absorber layer 216, capping layer 208, and portions of the reflective multi-material layers 206. The deposited polymer may efficiently protect the sidewalls of the openings 218, preventing further attack during the aggressive reflective multi-material layer etching process. Suitable examples of the oxygen containing gas include $O_2$, $N_2O$, $NO_2$, $O_3$, CO, $CO_2$ and $H_2O$ the like.

Additionally, a chlorine containing gas and/or a bromide containing gas may also be added to the etching gas mixture to assist etching the reflective multi-material layers 206 as needed. Examples of the chlorine-containing gas include $Cl_2$, HCl, $SiCl_4$, $BCl_3$, $CCl_4$, $CHCl_3$, $CH_2Cl_2$, $CH_3Cl$, combinations thereof and the like. Examples of the bromide containing gas include HBr, $Br_2$, combinations thereof, and the like. It is believed that bromide containing gas has relatively higher etching rate to the silicon layer 206b, as compared to molybdenum layer 206a. Accordingly, in the embodiment wherein the etching process is performed to selectively etch one layer at a time (e.g., when etching a molybdenum layer 206a, the underlying silicon layer 206b is used as an etch stop layer to provide an etch stop), chlorine and/or bromide containing gas may be alternatively used to individually etch the molybdenum layer 106a or the silicon layer 206b one at a time.

In an alternative embodiment, an inert gas may also be supplied into the etching gas mixture to assist the profile control as needed. Examples of the inert gas supplied in the gas mixture include Ar, He, Ne, Kr, Xe or the like.

In one embodiment, the fluorine containing gas and the oxygen containing gas supplied in the etching gas mixture may be maintained at a predetermined ratio to yield an efficient etching rate while sufficiently protecting the sidewall from undesired etching. In an exemplary embodiment, the fluorine containing gas and the oxygen containing gas is supplied in the etching gas mixture at a ratio between about 1 percent and about 20 percent. Alternatively, the fluorine containing gas may be supplied at a flow rate by volume between about 20 sccm and about 500 sccm. The oxygen containing gas may be supplied at a flow rate between about 1 sccm and about 100 sccm.

The chlorine containing gas may be supplied at a flow rate by volume at between about 20 sccm and about 500 sccm. The bromide containing gas may be supplied at a flow rate by volume at between about 10 sccm and about 100 sccm. The inert gas may be supplied at a flow rate between about 10 sccm and about 500 sccm. In the embodiment, wherein the chlorine containing gas or the bromide containing gas is supplied in the etching gas mixture along with the fluorine containing gas and the oxygen containing gas, the flow rate ratio of the fluorine containing gas to the chlorine and/or the bromide containing gas is controlled at between about 1:10 to about 1:10. The flow ratio of the oxygen containing gas to the total combined gas flow of the fluorine containing gas and/or the bromide containing gas is controlled at between about 1:1 to about 1:100.

At block 306, while etching the reflective multi-material layer 206, an incident optical beam 250 from the endpoint detection system 164 is directed to the etched substrate surface. The incident optical beam 250, as shown in FIG. 2A, from the etch rate detection system 164 is directed, through one of the windows in the chamber lid 13, onto one or more areas of the photomask substrate 102. The incident optical beam 250 is configured to be directed to the opening 218, such as open areas where the reflective multi-material layer 206 is exposed by the patterned photoresist layer 214 and the etched absorber layer 216 and the capping layer 208 to be etched to form trenches, vias, and apertures for the film stack 200 as needed.

A return beam 252, e.g., reflecting off the surface of reflective multi-material layers 206 within the openings 218 being etched and exposed, is detected by the photodetector 170 of the etch rate detection system 164. During etching of the reflective multi-material layer 206, the intensity of the reflected optical beam 252 changes overtime. The time-varying intensity of the reflected optical beam 252 at a particular wavelength is then analyzed to determine at least one of the depth etched, the etch rate and the end point of the reflective multi-material layer etching process.

At block 308, an etching process endpoint is determined by analyzing the waveform obtained from the detected reflected optical beam 252 reflected from the surface of the etched substrate. In the embodiment wherein the reflective multi-material layers 206 are composite layers having at least one molybdenum layer 206a and one silicon layer 206b formed therein, the reflected optical beam 252 initially detected is for etching the molybdenum layer 206a. After the molybdenum layer 206a is etched away, the reflected optical beam 252 may be continued to be collected for obtaining the waveform during etching of the silicon layer 206b. As the reflective multi-material layers 206 may include multiple repeated pairs of the molybdenum layer 206a and the silicon layer 206b, the incident optical beam 250 may continuously be directed to the substrate surface to collect waveforms from the reflected optical beam 252 until all repeating layers of the molybdenum layer 206a and the silicon layer 206b are etched away. The endpoint detection process may be continuously performed using the same wavelength or different wavelength as needed for detection until the whole reflective multi-material layer 206 is etched away, and exposing the underlying surface 226 of the substrate 102, as depicted in FIG. 2B.

Figure 4A:
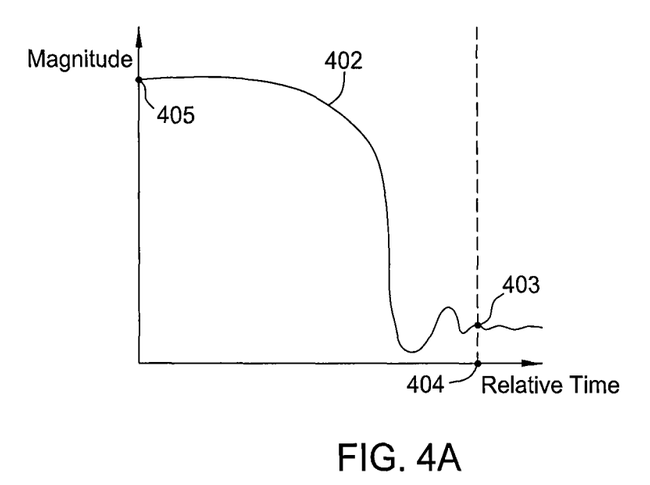
FIG. 4A illustrates one embodiment of optical signals detected for etch rate determination for etching reflective multi-material layers in accordance with one embodiment of the present invention.

FIG. 4A depicts one embodiment of optical signals as detected for etch rate determination for etching the reflective multi-material layers 206 at blanket areas formed on the substrate at a light wavelength at about 630 nm from the light source 166. In one embodiment, the wavelength used to detect is controlled between about 170 nm and about 800 nm. The optical signal 402, as shown in FIG. 4A, is plotted as a function of time to provide a waveform pattern corresponding to the varying intensity of the reflected optical beam 252 over time. The waveform pattern will be different at other wavelengths. Collecting a spectrum of wavelengths will provide numerous waveform patterns. The optical signal 402 is detected real-time when a production substrate is etched in the etch chamber. In the embodiment depicted in FIG. 4A, the intensity of the reflected optical beam 252 gradually decreases as the reflective multi-material layers 206 are gradually etched away. As the reflective multi-material layers 206 are configured to include reflective materials, the reflectivity of the reflected optical beam 252 is generally high when most of the reflective multi-material layers 206 still remain on the substrate 102. When the reflective multi-material layers 206 are gradually etched away and the underlying transparent quartz substrate 102 is gradually exposed, the reflectivity diminishes as more and more of the light passes through the transparent substrate 102 without being reflected. As depicted in FIG. 4A, when the intensity of the reflected optical beam 252 has a sudden drop to a low level 403 at a time point 404, the sudden drop of the reflected optical beam 252 and later became constant indicates that the reflective multi-material layers 206 have been etched away, exposing the underlying substrate 102, and thereby signally the time point 404 is the proper endpoint for etching away the reflective multi-material layers 206.

In one embodiment, an endpoint for etching the reflective multi-material layers 206 may be determined when the intensity of the reflected optical beam 252 is between about 60 percent and about 90 percent, such as about 80 percent, less than the initial reflected optical beam 252 collected in a beginning time point 405 of the detection process. In another embodiment, the endpoint for etching the reflective multi-material layers 206 may be determined when the optical signal 402 has become saturated and remains in a low steady state for about over than 10 seconds. In an exemplary embodiment wherein a light source of about 630 nm wavelength is utilized to detect the endpoint for etching the reflective multi-material layers 206, the process endpoint occurred at time point 404 is between about 150 seconds and about 600 seconds.

Figure 4B:
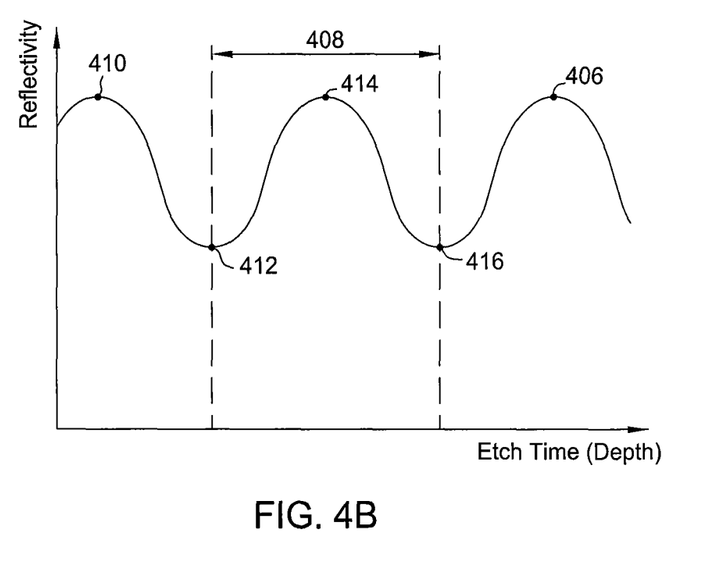
FIG. 4B illustrates one embodiment of optical signals detected for etch rate determination for etching reflective multi-material layers in accordance with another embodiment of the present invention.

FIG. 4B depicts one embodiment of the reflected optical beam 252 as detected for etch rate determination for etching the reflective multi-material layers 206 at a light wavelength at between about 170 nm and about 500 nm, such as between about 170 nm and about 350 nm, from the light source 166. The optical signal 406, as shown in FIG. 4B, is obtained from a reflective interferometry during the etching process and is plotted as a function of time to provide an interference waveform pattern corresponding to the varying intensity of the reflected optical beam 252 over time when etching the reflective multi-material layers 206. In the embodiment depicted in FIG. 4B, the intensity of the reflected optical beam 252 is varied during etching of the reflective multi-material layers 206.

The optical signal 406, as shown in FIG. 4B, is plotted as a function of time to provide a waveform pattern corresponding to the varying intensity of the reflected optical beam 252 over time. The optical signal 406 is detected real-time when a reference substrate is etched in the etch chamber so as to assist determining a proper endpoint for a production substrate when the production substrate is etched in the etch chamber. In the embodiment depicted in FIG. 4B, the intensity of the reflected optical beam 252 is repeated increases to a first level 410, e.g., a higher level, and then diminishes to a second level 412, e.g., a lower level, when the etching process is performed to sequentially etching the molybdenum layer 206a and the silicon layer 206b comprising in the reflective multi-material layers 206. It is believed that the reflectivity of optical signal 406 increases to the first level 410, 414 at the signal stop point, the surface of the molybdenum layer 206a is predominantly exposed. In contrast, the reflectivity of optical signal 406 diminishes to the second level 421, 416 at the signal stop point, the surface of the silicon layer 206b is predominantly exposed. Therefore, each different stop point, e.g., the levels 410, 412, 414, 416, at the interference waveform shown in the optical signal 406 indicates different etch depth of the reflective multi-material layers 206. When a fringe 408 appeases in the optical signal 406, the fringe 408 indicates that a layer of silicon layer 206b and molybdenum layer 206a has been etched away. Accordingly, the etching endpoint may be obtained by calculating the number of fringes 408 present in the optical signal 406 so as to obtain the depth of the reflective multi-material layers 206 been etched away from the substrate 102. Each fringe 408 represents a pair of silicon layer 206b and molybdenum layer 206a having been etched away. The appearance of the first level 410, 414 (e.g., the higher level) represents the exposure of the molybdenum layer 206a and the appearance of the second level 412, 416 (e.g., the lower level) represents the exposure of the silicon layer 206b.

Based on the etching phase of the waveform pattern shown in the optical signal 406, the structure depth being etched away may be calculated and predicted, so as to determine an etch rate of the optical signal reflective multi-material layers 206 and further determine a proper endpoint for the etching process. By utilizing the reference run to etch the reference substrate provided in the etch chamber to obtain a reference model for calculation, a proper endpoint of the reflective multi-material layer etching process may be determined. The reflectivity of the optical signal 406 may become constant when the whole reflective multi-material layers 206 are etched away and a process etching endpoint is reached.

Figure 4C:
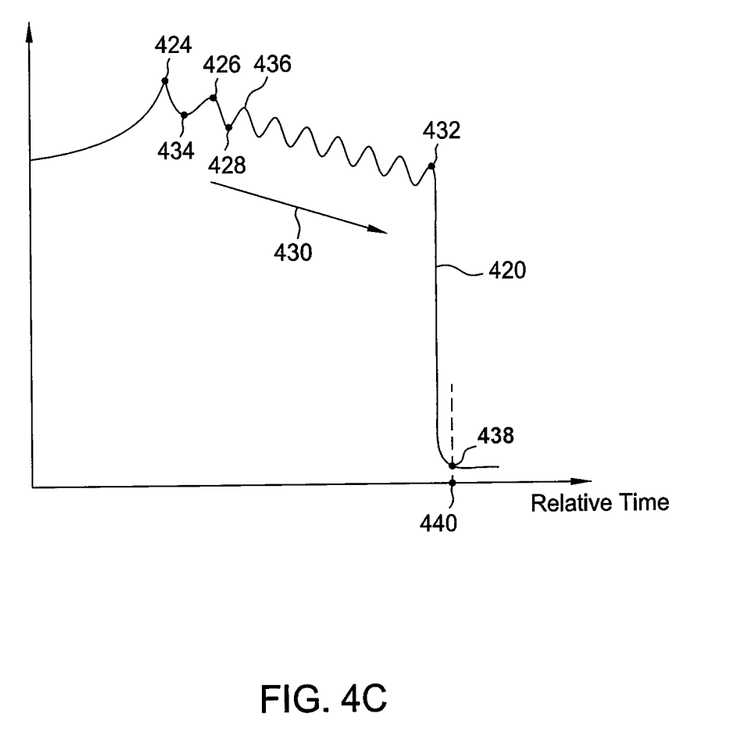
FIG. 4C illustrates one embodiment of optical signals detected for etch rate determination for etching reflective multi-material layers in accordance with yet another embodiment of the present invention.

FIG. 4C depicts another embodiment of the reflected optical beam 252 as detected for etch rate determination for etching the reflective multi-material layers 206 at a light wavelength at between about 170 nm and about 500 nm, such as between about 200 nm and about 230 nm, from the light source 166. The optical signal 420, as shown in FIG. 4C, is obtained from an OES or reflectivity counting during the etching process (including etching the upper capping layer 208 along with the reflective multi-material layers 206) and is plotted as a function of time to provide an intensity of the reflectivity monitored from the reflected optical beam 252 over time. In the embodiment depicted in FIG. 4C, the intensity of the reflected optical beam 252 is varied during etching and is gradually trending down, as indicated in arrow 430, when the reflective multi-material layers 206 is etched away and the transparent substrate 102 is gradually exposed. The optical signal 420 is detected real-time when a production substrate is etched in the etch chamber. In the embodiment depicted in FIG. 4C, the intensity of the reflected optical beam 252 is initially climbing to a first high level 424 when the upper capping layer 208 is exposed. When the intensity of the reflectivity goes down to a first low level 434, it indicates the capping layer 208 is etched away. When the intensity of the optical signal 420 reaches a second high level 426, the underlying first molybdenum layer 206a is non-exposed. Similarly, when intensity of the optical signal 420 forms to a trough, a second low level 428, the first molybdenum layer 206a has been etched away and the underling first silicon layer 206b is now exposed for etching. Repeatedly, when the intensity of the optical signal 420 climbs up again to the third high level 436, the first silicon layer 206b has been etched away (e.g., a first pair of molybdenum layer 206a and the silicon layer 206b is removed from the substrate 102) exposing the second molybdenum layer 206a defining part of a second layer pair for etching. A last repeating run of etching the pair of the molybdenum layer 206a and the silicon layer 206b may be observed when a high level 432 of intensity of reflectivity of the optical signal 420 appears, indicating that a molybdenum layer 206a in a last pair included in the reflective multi-material layers 206 is exposed. Subsequently, an endpoint of the reflective multi-material layers 206 may be determined when intensity of reflectivity of the optical signal 420 is dropped down to a low level 438 and remains constant at an end time point 440, having the intensity of reflectivity of the optical signal 420 maintained at the low level for about at least 10 seconds.

Accordingly, the etching endpoint may be obtained by calculating the number of fringes present in the optical signal 420 so as to obtain the number of the repeated pairs of the molybdenum layer 206a and the silicon layer 206b that have been etched away from the substrate 102 during the etching process. The endpoint may be obtained when the intensity of reflectivity of the optical signal 420 remains low and constant.

By monitoring reflectivity of an optical beam reflected at a predetermined wavelength from etched reflective multi-material layers, such as including at least a molybdenum layer and a silicon layer, process endpoints may be obtained by analyzing waveforms and/or number of fringes appearing from the reflected optical beam reflected from an etched substrate surface. The embodiments of the present invention provide an improved apparatus and method with enhanced process monitoring and control capabilities. These improvements also allow reliable etch rate/loss of thickness and endpoint determination for absorber layer etching applications.

While the foregoing is directed to embodiments of the present invention, other and further embodiments of the invention may be devised without departing from the basic scope thereof, and the scope thereof is determined by the claims that follow.

The invention claimed is:

1. A method of determining an etching endpoint of a reflective multi-material layer disposed on a substrate during an etching process, comprising:
    performing an etching process on a reflective multi-material layer, wherein the reflective multi-material layer includes at least one molybdenum layer and one silicon layer disposed on a first surface of a substrate through a patterned mask layer in a plasma etch chamber;
    directing radiation having a wavelength from about 170 nm and about 800 nm to an area of the multi-material layer uncovered by the patterned mask layer during the etching process;
    collecting an optical signal reflected from the area uncovered by the patterned mask layer;
    analyzing a waveform obtained from the reflected optical signal; and
    determining a first endpoint of the etching process when an intensity of the reflected optical signal is between about 60 percent and about 90 percent less than an initial reflected optical signal.

2. The method of claim 1, wherein the substrate is a photomask reticle.

3. The method of claim 1, wherein the radiation source has a wavelength about 630 nm.

4. The method of claim 1, wherein analyzing the waveform further comprises:
    obtaining a first spectrum in a reflective form plotted as a function of time from the reflected optical signal.

5. The method of claim 1, wherein the reflective multi-material layers includes about forty repeating layers of molybdenum layers and silicon layers.

6. The method of claim 1, wherein an absorber layer is disposed on a capping layer inserted between the patterned photoresist layer and the reflective multi-material layer.

7. The method of claim 1, wherein the molybdenum layer has a thickness between about 1 Å and about 10 Å and the silicon layer has a thickness between about 1 Å and about 10 Å.

* * * * *

UNITED STATES PATENT AND TRADEMARK OFFICE
CERTIFICATE OF CORRECTION

PATENT NO. : 8,808,559 B2  
APPLICATION NO. : 13/543845  
DATED : August 19, 2014  
INVENTOR(S) : Grimbergen

Page 1 of 1

It is certified that error appears in the above-identified patent and that said Letters Patent is hereby corrected as shown below:

In the Specification:

Column 6, Line 64, please delete "1748" and insert --174B-- therefor.

Signed and Sealed this  
Sixth Day of January, 2015

Michelle K. Lee  
*Deputy Director of the United States Patent and Trademark Office*